United States Patent
Sawabe et al.

(10) Patent No.: US 9,679,911 B2
(45) Date of Patent: Jun. 13, 2017

(54) SEMICONDUCTOR MEMORY DEVICE AND PRODUCTION METHOD THEREOF

(71) Applicant: KABUSHIKI KAISHA TOSHIBA, Minato-ku (JP)

(72) Inventors: Ryosuke Sawabe, Yokkaichi (JP); Shigeki Kobayashi, Kuwana (JP); Takamasa Okawa, Yokkaichi (JP); Kei Sakamoto, Nagoya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/970,919

(22) Filed: Dec. 16, 2015

(65) Prior Publication Data

US 2017/0077120 A1    Mar. 16, 2017

Related U.S. Application Data

(60) Provisional application No. 62/217,495, filed on Sep. 11, 2015.

(51) Int. Cl.
*H01L 29/76* (2006.01)
*H01L 27/11582* (2017.01)
*H01L 21/768* (2006.01)
*H01L 21/02* (2006.01)
*H01L 27/11556* (2017.01)

(52) U.S. Cl.
CPC .. *H01L 27/11582* (2013.01); *H01L 21/02532* (2013.01); *H01L 21/76805* (2013.01); *H01L 21/76831* (2013.01); *H01L 21/76846* (2013.01); *H01L 21/76877* (2013.01); *H01L 27/11556* (2013.01)

(58) Field of Classification Search
CPC ......... H01L 27/11582; H01L 27/11556; H01L 21/76846; H01L 21/76877; H01L 21/76805; H01L 21/02532; H01L 21/76831
See application file for complete search history.

(56) References Cited

U.S. PATENT DOCUMENTS

2014/0070302 A1    3/2014  Yoo et al.
2015/0129878 A1*   5/2015  Shin .................. H01L 27/11578
                                                                257/66

(Continued)

FOREIGN PATENT DOCUMENTS

JP          2014-57067          3/2014

*Primary Examiner* — John C Ingham
*Assistant Examiner* — Wasiul Haider
(74) *Attorney, Agent, or Firm* — Oblon, McClelland, Maier & Neustadt, L.L.P.

(57) ABSTRACT

A semiconductor memory device according to an embodiment includes a memory cell array which has: a first conductive layer which is arranged in a first direction on a first semiconductor layer; a second conductive layer which is arranged in the first direction above the first conductive layer; a columnar second semiconductor layer which extends in the first direction; and a contact unit which electrically connects the first semiconductor layer and the second conductive layer. The contact unit has a first film which contains silicide as a first metal, and is in contact with the first semiconductor layer; and a second film which contains the first metal, is in contact with the first film, and is in contact with the first semiconductor layer with the first film interposed therebetween.

5 Claims, 9 Drawing Sheets

(56) References Cited

U.S. PATENT DOCUMENTS

2016/0049421 A1* 2/2016 Zhang .............. H01L 27/11582
  257/314
2016/0093637 A1* 3/2016 Lee .................. H01L 27/11582
  438/269

* cited by examiner

SEMICONDUCTOR MEMORY DEVICE AND PRODUCTION METHOD THEREOF

CROSS-REFERENCE TO RELATED APPLICATIONS

This application is based upon and claims the benefit of priority from the prior U.S. Provisional Application 62/217,495, filed on Sep. 11, 2015, the entire contents of which are incorporated herein by reference.

BACKGROUND

Technical Field

An embodiment of the present invention relates to a semiconductor memory device and a production method thereof.

Description of the Related Art

One of semiconductor memory devices is a flash memory. In particular, a NAND flash memory has been widely used, in general, due to low cost and a large capacity. In addition, many techniques have been suggested so far in order to obtain a larger capacity of the NAND flash memory. One of the suggestions is a structure in which memory cells are three-dimensionally arranged.

DETAILED DESCRIPTION

A semiconductor memory device according to an embodiment includes a memory cell array including: a first conductive layer which is arranged in a first direction above a first semiconductor layer; a second conductive layer which is arranged in the first direction above the first conductive layer; a columnar second semiconductor layer which extends in the first direction; and a contact unit which electrically connects the first semiconductor layer and the second conductive layer, and the contact unit including: a first film which contains silicide as a first metal, and is in contact with the first semiconductor layer; and a second film which contains the first metal, is in contact with the first film, and is in contact with the first semiconductor layer with the first film interposed therebetween.

Hereinafter, a description will be given regarding a semiconductor memory device according to an embodiment and a production method thereof with reference to the drawings.

Incidentally, the following embodiment relates to a semiconductor memory device with a structure in which a metal-oxide-nitride-oxide-semiconductor (MONOS) transistor, which has a columnar semiconductor layer arranged to be vertical to a semiconductor substrate and serving as a channel and a conductive layer arranged with respect to a side surface of the semiconductor layer with a charge storage layer interposed therebetween and serving as a gate electrode, is provided as a memory cell, and a plurality of the MONOS transistors are arranged in a stacking direction. However, the following embodiment is not limited thereto, and may be also applied to a semiconductor memory device with a structure, for example, in which a semiconductor-oxide-nitride-oxide-semiconductor (SONOS) transistor, a metal-aluminum oxide-nitride-oxide-semiconductor (MANOS) transistor, a transistor in which an insulating layer is made of hafnium oxide ($HfO_x$), tantalum oxide ($TaO_x$), or the like, a floating gate transistor, and the like is provided as the memory cell.

First, a description will be given regarding the entire configuration of the semiconductor memory device according to the embodiment.

Figure 1:
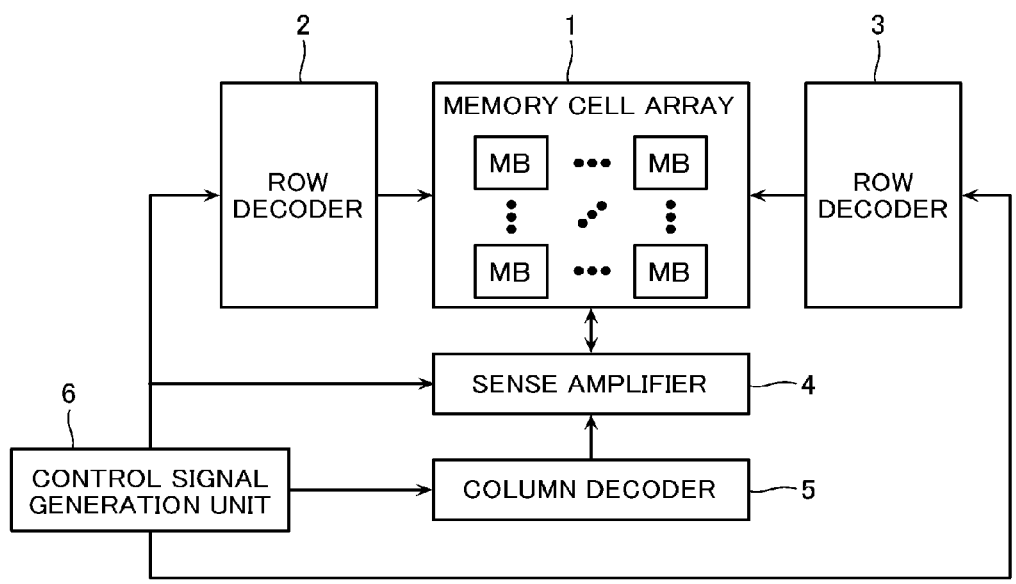
FIG. 1 is a diagram illustrating a functional block of a semiconductor memory device according to an embodiment.

FIG. 1 is a diagram illustrating a functional block of the semiconductor memory device according to the embodiment.

The semiconductor memory device according to the embodiment includes a memory cell array 1, row decoders 2 and 3, a sense amplifier 4, a column decoder 5, and a control signal generation unit 6. The memory cell array 1 has a plurality of memory blocks MB. Each of the memory blocks MB has a plurality of memory cells MC that are three-dimensionally arranged. The row decoders 2 and 3 decode a received block address signal and the like, and control a write operation and a read operation of data of the memory cell array 1. The sense amplifier 4 detects and amplifies an electrical signal flowing in the memory cell array 1 during the read operation. The column decoder 5 decodes a column address signal, and controls the sense amplifier 4. The control signal generation unit 6 increases a reference voltage, generates a high voltage to be used during the write operation and an erase operation, and further, generates a control signal to control the row decoders 2 and 3, the sense amplifier 4, and the column decoder 5.

Next, a description will be given regarding a circuit configuration of the memory cell array 1.

Figure 2:
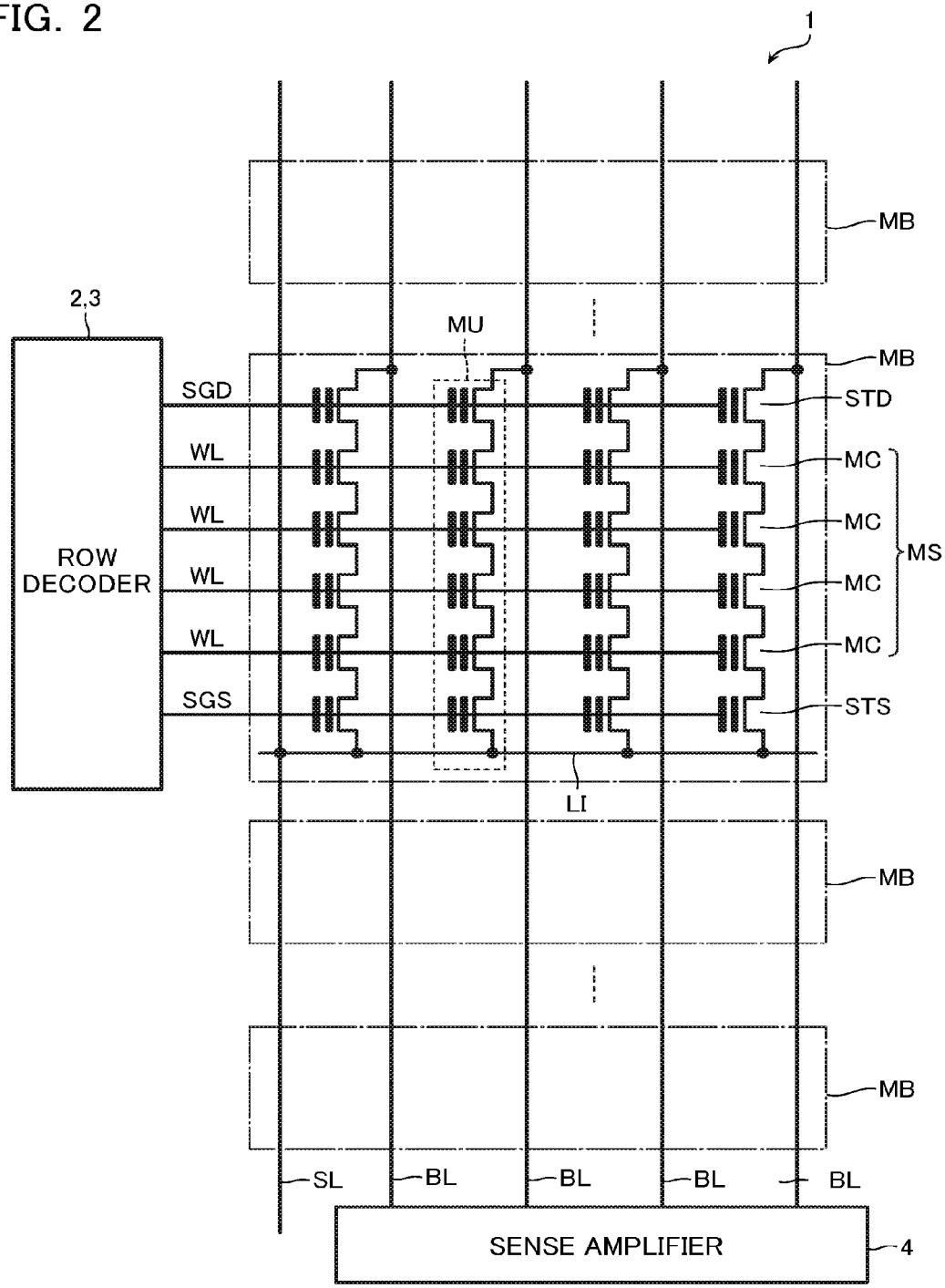
FIG. 2 is an equivalent circuit diagram of a memory cell array of the semiconductor memory device according to the embodiment.

FIG. 2 is an equivalent circuit diagram of the memory cell array of the semiconductor memory device according to the embodiment.

The memory cell array 1 has the plurality of memory blocks MB as illustrated in FIG. 2. A plurality of bit lines BL and source lines SL are connected commonly to the plurality of memory blocks MB. Each of the memory blocks MB is connected to the sense amplifier 4 via the bit line BL, and is connected to a source line driver (not illustrated) via the source line SL.

The memory block MB has a plurality of memory units MU each of which has one end connected to the bit line BL, and the other end connected to the source line SL via a source contact LI. Each of the memory units MU has a memory string MS, a source-side select transistor STS connected between the memory string MS and the source contact LI, and a drain-side select transistor STD connected between the memory string MS and the bit line BL.

The memory string MS has the plurality of memory cells MC which are connected in series. Each of the memory cells MC is a transistor having a semiconductor layer, a charge storage layer, and a control gate, and stores a charge in the charge storage layer depending on a voltage applied to the control gate, and changes a threshold value. Word lines WL are commonly connected to the control gates of the plurality of memory cells MC, respectively, that belong to the memory strings MS different from each other. The plurality of memory cells MC are connected to the row decoder 2 or 3 via the word lines WL.

The source-side select transistor STS has a control gate to which a source-side select gate line SGS is connected. The source-side select gate line SGS is connected to the row decoder 2 or 3, and selectively connects the memory string MS with the semiconductor substrate depending on an input signal.

The drain-side select transistor STD has a control gate to which a drain-side select gate line SGD is connected. The drain-side select gate line SGD is connected to the row decoder 2 or 3, and selectively connects the memory string MS with the bit line BL depending on an input signal.

Next, a description will be given regarding a schematic structure of the memory cell array 1.

Figure 3:
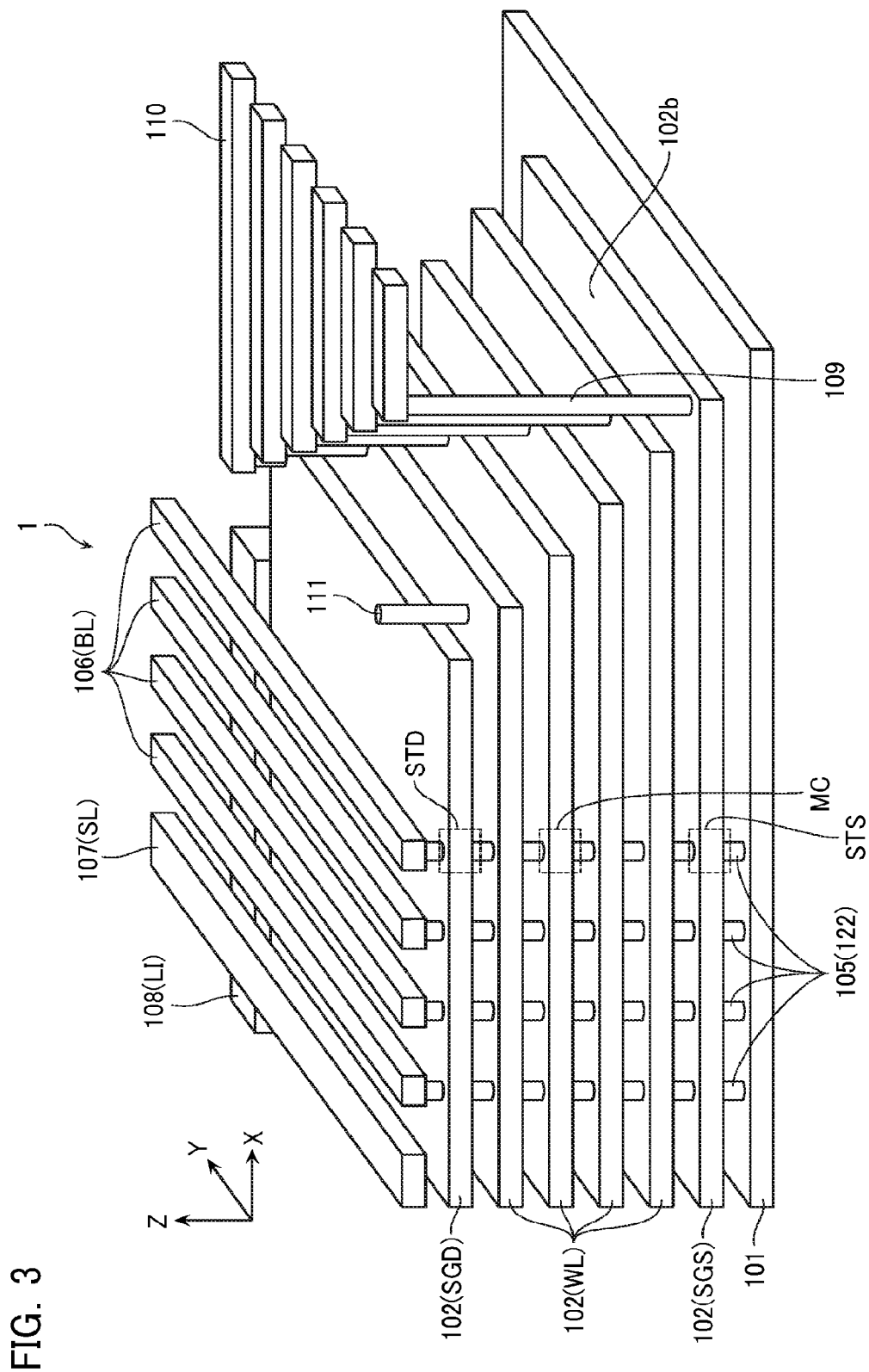
FIG. 3 is a perspective view illustrating a schematic structure of the memory cell array of the semiconductor memory device according to the embodiment.

FIG. 3 is a perspective view illustrating the schematic structure of the memory cell array of the semiconductor memory device according to the embodiment.

The memory cell array 1 has a semiconductor substrate 101 (first semiconductor layer) and a plurality of conductive layers 102 (second conductive layers) that are stacked in a Z direction (first direction) above the semiconductor substrate 101 as illustrated in FIG. 3.

In addition, the memory cell array 1 has a plurality of memory pillars 105 extending in the Z direction. An intersecting portion of the conductive layer 102 and the memory pillar 105 functions as the source-side select transistor STS, the memory cell MC, or a drain-side select transistor STD. The conductive layer 102 is made of, for example, tungsten (W), polysilicon (Poly-Si), or the like, and functions as the source-side select gate line SGS, the word line WL, or the drain-side select gate line SGD.

The plurality of conductive layers 102 have end portions formed in a stepwise manner. That is, a predetermined one of the conductive layers 102 has a contact unit 102*b* that does not oppose a lower surface of another conductive layer 102 positioned at an upper layer. In addition, the conductive layer 102 is connected to a via 109 in the contact unit 102*b*. A wiring 110 is arranged on an upper end of the via 109. Incidentally, the via 109 and the wiring 110 are made of, for example, tungsten (W) or the like.

In addition, the memory cell array 1 has a conductive layer 108 which opposes each side surface in a Y direction of the plurality of conductive layers 102, and extends in an X direction. A lower surface of the conductive layer 108 is in contact with the semiconductor substrate 101. In addition, an implanted region 101*a* in which an N-type or a P-type impurity has been implanted is formed in a part being in contact with the conductive layer 108 in the semiconductor substrate 101. The conductive layer 108 is made of, for example, tungsten (W) or the like, and functions as the source contact LI. The source contact LI and a peripheral structure thereof will be described later.

In addition, the memory cell array 1 has a plurality of conductive lines 106 and conductive lines 107 which are positioned above the plurality of conductive layers 102 and memory pillars 105 and arranged side by side in the X direction extending in the Y direction. The memory pillar 105 is electrically connected to each lower surface of the conductive lines 106. Incidentally, the conductive line 106 is made of, for example, tungsten (W) or the like, and functions as the bit line BL. The conductive layer 108 is electrically connected to a lower surface of the conductive line 107. Incidentally, the conductive line 107 is made of, for example, tungsten (W), and functions as the source line SL.

In addition, the memory cell array 1 has a beam pillar 111. The beam pillar 111 maintains a position of an interlayer insulating layer (not illustrated) to be arranged between the conductive layers 102 in a production process.

Next, a description will be given regarding a schematic structure of the memory cell MC.

Figure 4:
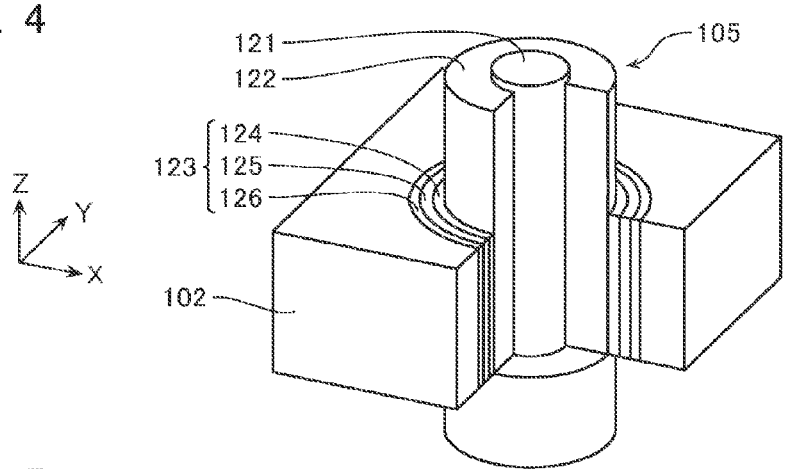
FIG. 4 is a perspective view illustrating a memory pillar of the memory cell array of the semiconductor memory device according to the embodiment and a peripheral structure thereof.

FIG. 4 is a perspective view illustrating the schematic structure of the memory cell of the semiconductor memory device according to the embodiment. Incidentally, the source-side select transistor STS and the drain-side select transistor STD may also have the same structure as that of FIG. 3.

The memory cell MC is formed in the intersecting portion of the conductive layer 102 and the memory pillar 105. The memory pillar 105 has a core insulating layer 121 and a semiconductor layer 122 (second semiconductor layer) that covers a side surface of the core insulating layer 121. Further, the memory cell array 1 has a multi-film layer 123 which is arranged in an intersecting portion of the conductive layer 102 and the semiconductor layer 122. The multi-film layer 123 has a tunnel insulating layer 124, a charge storage layer 125, and a block insulating layer 126 which are deposited from the semiconductor layer 122 onto the conductive layer 102. In the embodiment, the structure from the core insulating layer 121 to the block insulating layer 126 is included in the memory pillar 105.

The core insulating layer 121 is made of, for example, silicon oxide ($SiO_2$) or the like. The semiconductor layer 122 is made of, for example, polysilicon (Poly-Si) or the like, and functions as a channel of the memory cell MC, the source-side select transistor STS, or the drain-side select transistor STD. The tunnel insulating layer 124 is made of, for example, silicon oxide ($SiO_2$) or the like. The charge storage layer 125 is made of, for example, nitride silicon (SiN) or the like, which is capable of storing a charge. The block insulating layer 126 is made of, for example, silicon oxide ($SiO_2$) or the like.

Incidentally, a block high dielectric layer and a barrier layer may be deposited on the multi-film layer 123 from the block insulating layer 126 onto the conductive layer 102. The block high dielectric layer is made of, for example, metal oxide such as alumina ($Al_2O_3$) or hafnium oxide ($HfO_x$). The barrier layer made of, for example, metal nitride such as titanium nitride (TiN), tungsten nitride (WN), or tantalum nitride (TaN).

Next, a description will be given regarding the source contact LI and a peripheral structure thereof with reference to a cross-section of the memory cell array 1.

Figure 5:
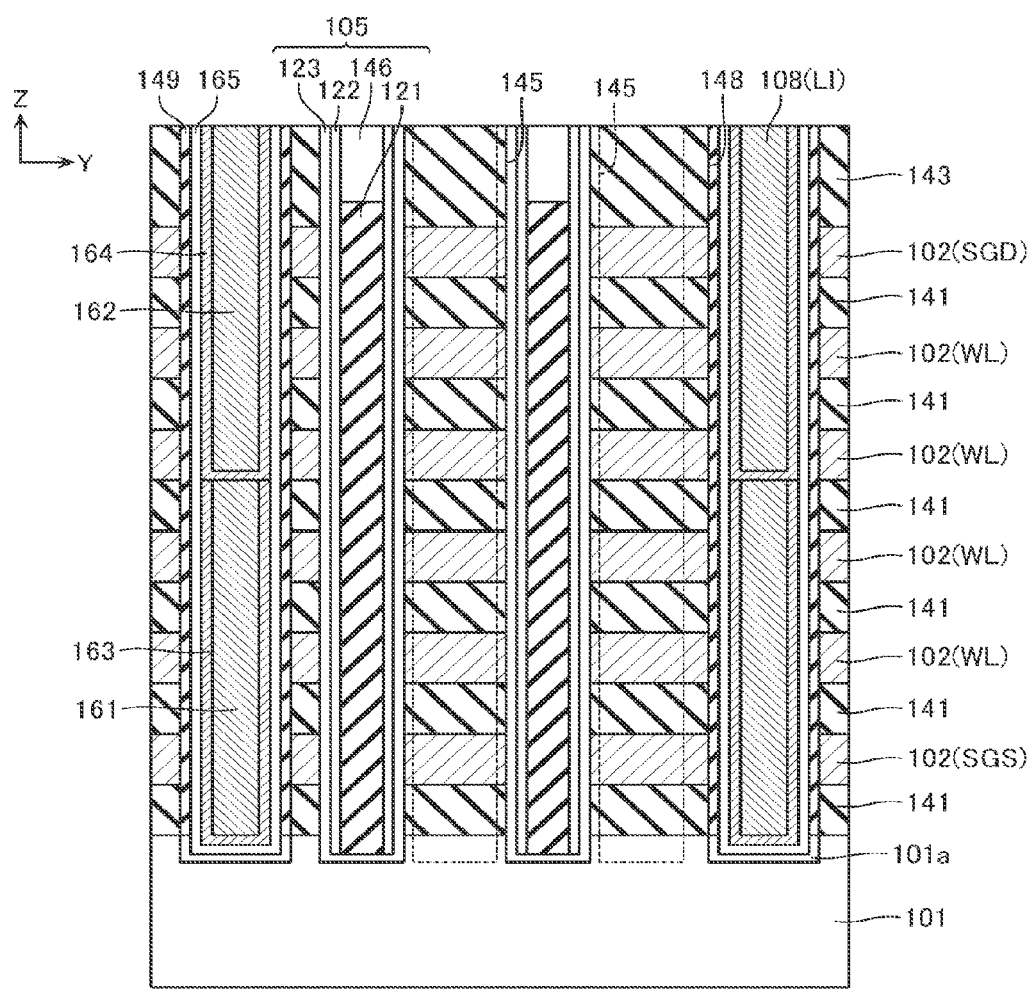
FIG. 5 is a cross-sectional view of the memory cell array of the semiconductor memory device according to the embodiment.

FIG. 5 is a cross-sectional view of the memory cell array of the semiconductor memory device according to the embodiment. FIG. 5 is a cross-sectional view of Y-Z directions.

The memory cell array 1 has an interlayer insulating layer 141 and the conductive layer 102, which are alternately stacked, in plural, above the semiconductor substrate 101 and an interlayer insulating layer 143 stacked above the conductive layer 102. In addition, a plurality of memory holes 145, which penetrate through the interlayer insulating layer 143 at the uppermost layer to the interlayer insulating layer 141 at the lowermost layer in the Z direction and reach an upper portion of the semiconductor substrate 101, are formed in the memory cell array 1, and the plurality of memory pillars 105 are embedded in the memory holes 145.

As described above, the memory pillar 105 has the multi-film layer 123 including the core insulating layer 121, the semiconductor layer 122, the tunnel insulating layer 124, the charge storage layer 125, and the block insulating layer 126 from the center thereof to the outer side. In addition, the memory pillar 105 has a cap semiconductor layer 146 which is in contact with an upper surface of the core insulating layer 121 and an inner side surface of the semiconductor layer 122.

In addition, a plurality of trenches 148, each of which has a depth direction in the Z direction, a bottom surface reaching an upper surface of the semiconductor substrate 101, and an extending direction in the X direction, are formed in the memory cell array 1 so as to sandwich an arrangement region of the memory pillar 105 in the Y direction. The conductive layer 108 is arranged on the trench 148 with an insulating layer 149 interposed therebetween.

The conductive layer 108 has conductive films 161 (third film) and 162 (fourth film), and barrier films 163 (second film) and 164 (second film). The conductive film 161 is a plate-like body that extends in the X direction and the Z direction in approximately a lower half of the trench 148, and is made of, for example, polysilicon (Poly-Si) into which an impurity is introduced. The conductive film 162 is a plate-like body that extends in the X direction and the Z direction in approximately an upper half of the trench 148, and is made of, for example, tungsten (W). The barrier film 163 is arranged so as to cover a bottom surface and a side surface of the conductive film 161. The barrier film 164 is arranged so as to cover a bottom surface and a side surface of the conductive film 162, and a bottom surface thereof is in contact with an upper surface of the conductive film 161. The barrier films 163 and 164 are made of, for example, titanium (Ti), titanium nitride (TiN), tantalum (Ta), or the like, which is a first metal. When the conductive layer 108 is formed to have the structure (hereinafter, also referred to as a "hybrid structure" in some cases) in which the two conductive films 161 and 162, made of different materials, are stacked in the Z direction in this manner, it is possible to reduce warpage of a wafer that is caused due to a film stress of tungsten (W) as compared to a structure provided only with a single conductive layer made of tungsten (W). In addition, in the embodiment, the conductive layer 108 has a metal diffusion prevention layer 165 (first film) arranged between the semiconductor substrate 101 and the barrier film 163. An inner side of the metal diffusion prevention layer 165 is in contact with a bottom surface and a side surface of the barrier film 163 and the side surface of the barrier film 164. On the other hand, an outer side of the metal diffusion prevention layer 165 is in contact with the semiconductor substrate 101 at a bottom portion thereof, and is in contact with the insulating layer 149 at a side surface thereof except for the bottom portion. Accordingly, the barrier film 163 is not in direct contact with, but is in contact with the semiconductor substrate 101 with the metal diffusion prevention layer 165 interposed therebetween. An effect of the metal diffusion prevention layer 165 will be described later.

Here, it is understood that each electrical resistivity of the conductive films 161 and 162, and the barrier films 163 and 164 of the conductive layer 108 is set, depending on a material forming each member, to be low in an order from the conductive film 162 made of tungsten (W), the barrier films 163 and 164 made of titanium (Ti), titanium nitride (TiN), or tantalum (Ta), and the conductive film 161 made of polysilicon (Poly-Si) into which the impurity is introduced. As a result, most of the current flowing in the conductive layer 108 in the X direction flows through the conductive film 162, and thus, the barrier films 163 and 164 hardly influence the current flowing in the X direction. On the contrary, the current flowing in the conductive layer 108 in the Z direction flows through the barrier films 163 and 164, and thus, the influence of the barrier films 163 and 164 is great. Actually, the resistance in the Z direction of the conductive layer 108 is almost inversely proportional to the film thickness of the barrier films 163 and 164. Further, it is desirable to thicken the barrier films 163 and 164 in order to bring out a large cell current when considering that the current flowing in the Z direction also obviously includes the cell current. However, the following problem occurs when thickening the barrier films 163 and 164.

Figure 6:
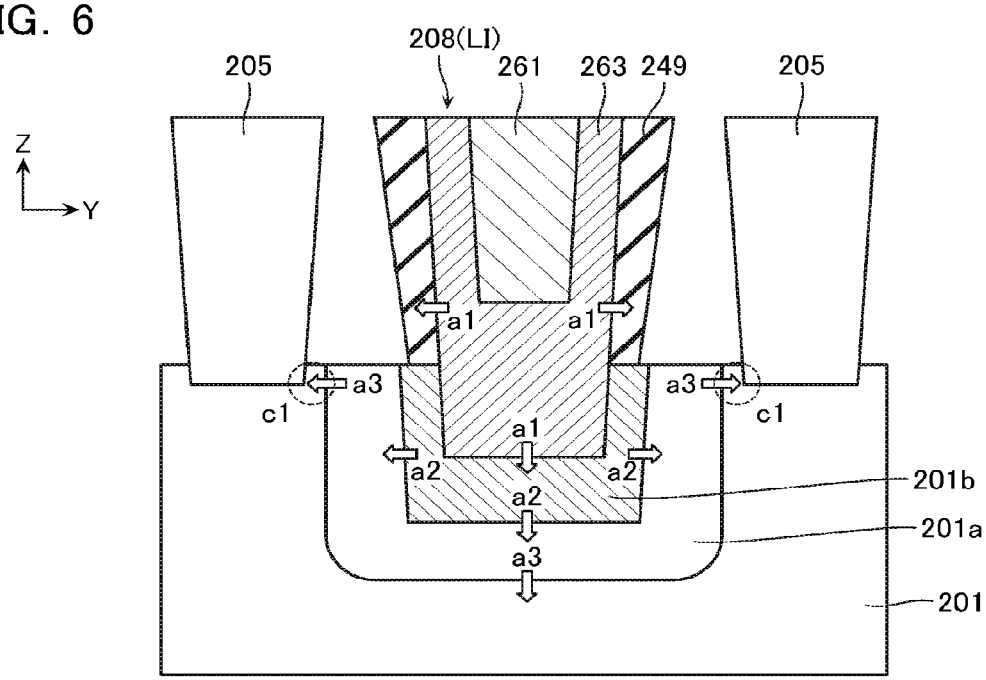
FIG. 6 is a cross-sectional view of a periphery of a bottom portion of a source contact of a semiconductor memory device according to a comparative example with respect to the embodiment.

FIG. 6 is a schematic cross-sectional view of a periphery of a bottom portion of a source contact of a semiconductor memory device according to a comparative example with respect to the embodiment. FIG. 6 is the cross-sectional view of the Y-Z direction. FIG. 6 illustrates a semiconductor substrate 201 (similar to the semiconductor substrate 101), two memory pillars 205 (similar to the memory pillar 105) arranged on the semiconductor substrate 201, and a conductive layer 208 (the source contact LI) sandwiched by insulating layers 249 (similar to the insulating layer 149) between the memory pillars 205 above the semiconductor substrate 201.

The conductive layer 208 of the comparative example has a conductive film 261, and a barrier film 263 arranged between the semiconductor substrate 201 and the conductive film 261. The conductive film 261 is a configuration corresponding to the conductive film 161, and is made of, for example, polysilicon (Poly-Si) into which an impurity is introduced. The barrier film 263 is a configuration corresponding to the barrier film 163, and is made of, for example, titanium (Ti), titanium nitride (TiN), tantalum (Ta), or the like. The barrier film 263 is formed to be thicker than the barrier film 163. In other words, the conductive layer 208 of the comparative example has a structure in which the barrier film 263 is thickened without providing the metal diffusion prevention layer 165 as compared to the conductive layer 108 of the embodiment.

In the case of the conductive layer 208, it is possible to lower the resistance of the barrier film 263 as much as thickening the barrier film 263. On the contrary, since the barrier film 263 is thickened, the diffusion of titanium (Ti) to the periphery thereof increases (the white arrow a1 in FIG. 6) in a case in which the barrier film 263 is made of titanium (Ti) or titanium nitride (TiN), for example. Thus, a silicide region 201b (TiSi$_2$), made of titanium (Ti), having a high resistance to be formed on an upper portion of the semiconductor substrate 201 is widened (the white arrow a2 in FIG. 6). In addition, when an implanted region 201a is widened (the white arrow a3 in FIG. 6) so as to suppress increase of junction leakage current accompanying the widening of the silicide region 201b, the implanted region 201a intrudes into an arrangement region of the memory pillar 205 (the broken-line circle c1 in FIG. 6). As a result, a cut-off characteristic of the source-side select transistor STS is degraded, which becomes the problem.

In regard to such a point, the conductive layer 108 of the embodiment has the metal diffusion prevention layer 165.

Figure 7:
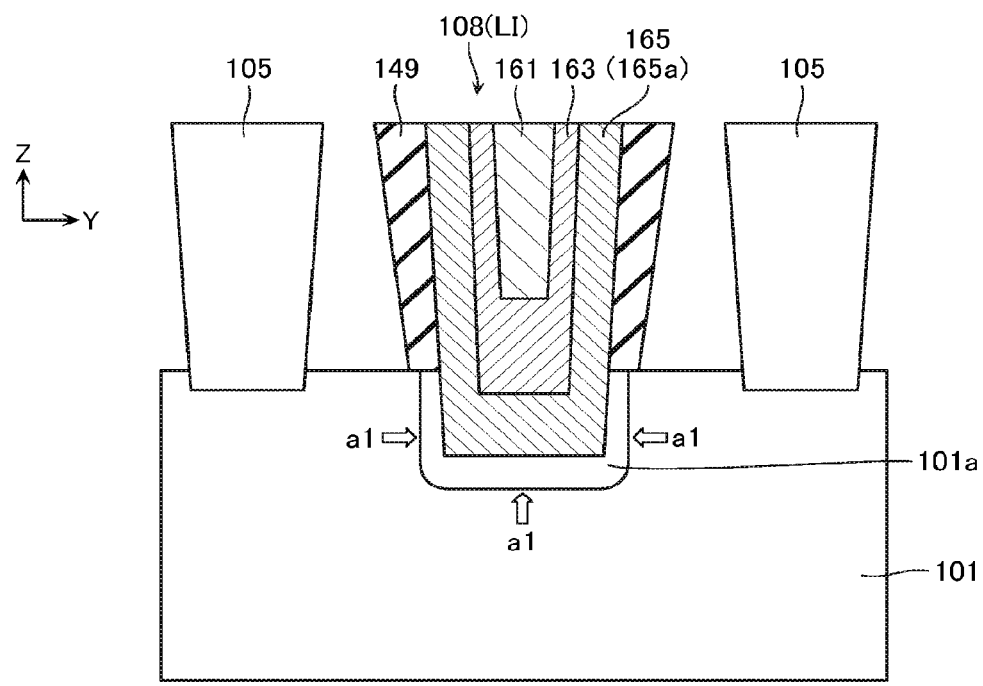
FIG. 7 is a cross-sectional view of a periphery of a bottom portion of a source contact of the semiconductor memory device according to the embodiment.

FIG. 7 is a cross-sectional view of a periphery of a bottom portion of a source contact of the semiconductor memory device according to the embodiment.

The metal diffusion prevention layer 165 of the conductive layer 108 is made of silicide of metal included in the barrier film 163. To be specific, in a case in which the barrier film 163 is made of titanium (Ti) or titanium nitride (TiN), the metal diffusion prevention layer 165 is made of silicide (TiSi$_2$) of titanium (Ti). The metal diffusion prevention layer 165 is a film obtained by being deposited first using silicon (Si), which is a material of the semiconductor substrate 101, and then, silicided by titanium (Ti) diffusing from the barrier film 163 in the production process of the source contact to be described later. Incidentally, a silicide portion, which is silicided, of the metal diffusion prevention layer 165 will be referred with reference numeral 165a, and a polysilicon portion, which is not silicided, will be referred with reference numeral 165b (165b is not shown in FIG. 7). FIG. 7 is an example in which the metal diffusion prevention layer 165 forms the silicide part 165a.

Next, a description will be given regarding a production process of the source contact LI.

FIGS. 8 to 11 are cross-sectional views that describe the production processes of the source contact of the semiconductor memory device according to the embodiment. FIGS. 8 to 11 are the cross-sectional views of the Y-Z direction. Here, a description will be given regarding a process after deposition of the insulating layer 149 with respect to a sidewall of the trench 148 after formation of the trench 148. The trench 148 has the bottom surface reaching at least the upper surface of the semiconductor substrate 101, and divides the conductive layer 102.

Figure 8:
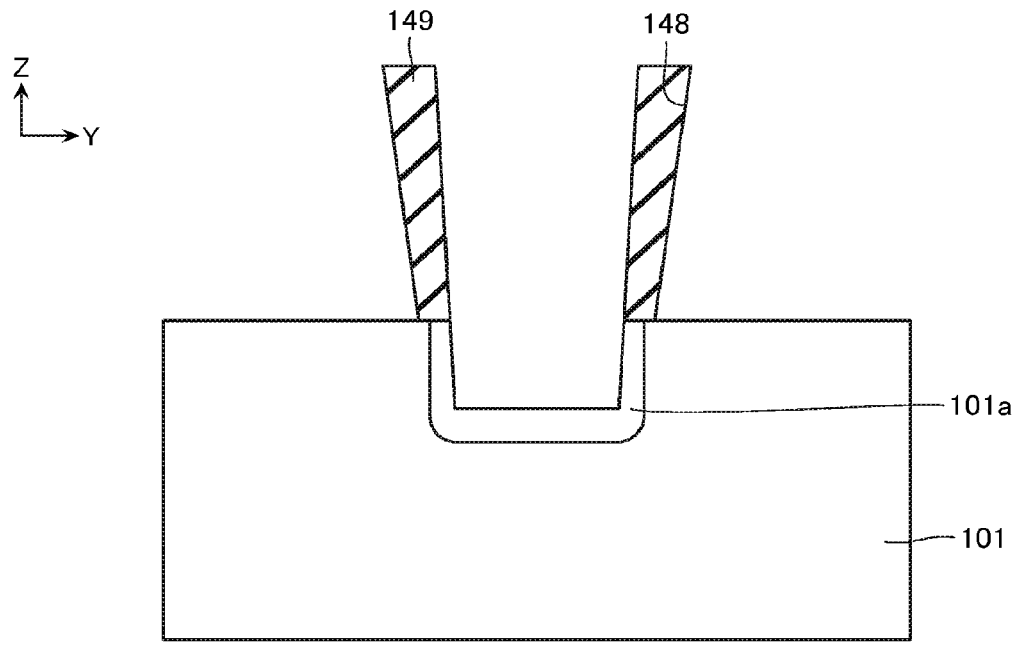
FIGS. 8 to 11 are cross-sectional views that describe production processes of the source contact of the semiconductor memory device according to the embodiment.

In FIG. 8, a bottom part of the insulating layer 149 formed inside the trench 148 is removed using, for example, reactive ion etching (RIE). Accordingly, the implanted region 101a formed in the upper portion of the semiconductor substrate 101 is exposed to the trench 148, thereby securing conduction between the semiconductor substrate 101 and the conductive layer 108 to be formed at a subsequent process.

Figure 9:
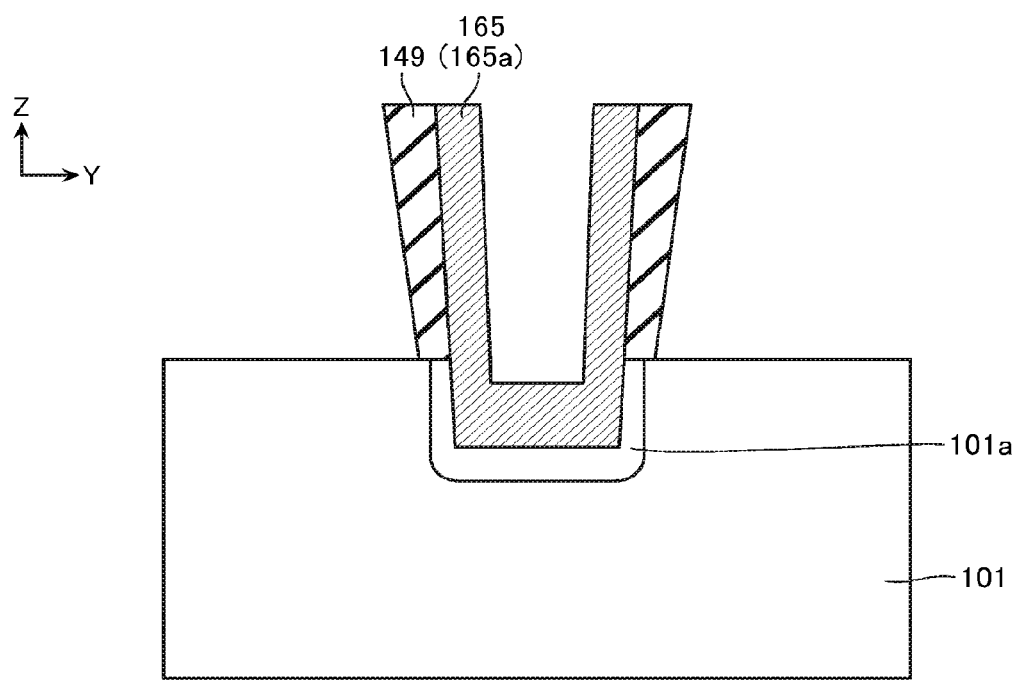

In FIG. 9, the metal diffusion prevention layer 165 is deposited with respect to the upper surface of the semiconductor substrate 101 exposed to the bottom portion of the trench 148 and a sidewall of the insulating layer 149. At this time, the metal diffusion prevention layer 165 is deposited at least from the bottom surface of the trench 148 to the upper surface of the semiconductor substrate 101. In the case of FIG. 9, the metal diffusion prevention layer 165 is deposited with respect to the entire side surface of the trench 148. Here, the metal diffusion prevention layer 165 is formed using the same material as that of the semiconductor substrate 101, and is made of, for example, silicon (Si). In this case, the metal diffusion prevention layer 165 is deposited using, amorphous silicon (a-Si), and then, becomes polysilicon (Poly-Si) through an annealing process. Incidentally, at this point in time, the metal diffusion prevention layer 165 forms the polysilicon portion 165b as a whole. A part or all of the metal diffusion prevention layer 165 is silicided to form the silicide part 165a by the diffusion of metal of the barrier film 163 caused by heat treatment or the like.

Figure 10:
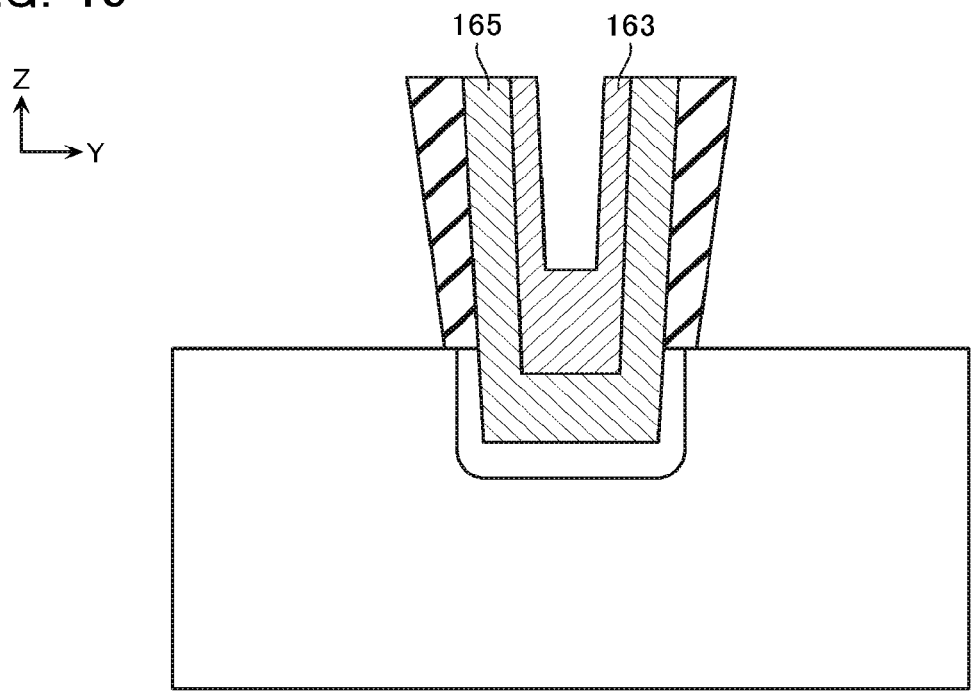

In FIG. 10, the barrier film 163 is deposited with respect to the bottom surface and the side surface of the metal diffusion prevention layer 165. The barrier film 163 is made of, for example, titanium (Ti), titanium nitride (TiN), or tantalum (Ta).

Figure 11:
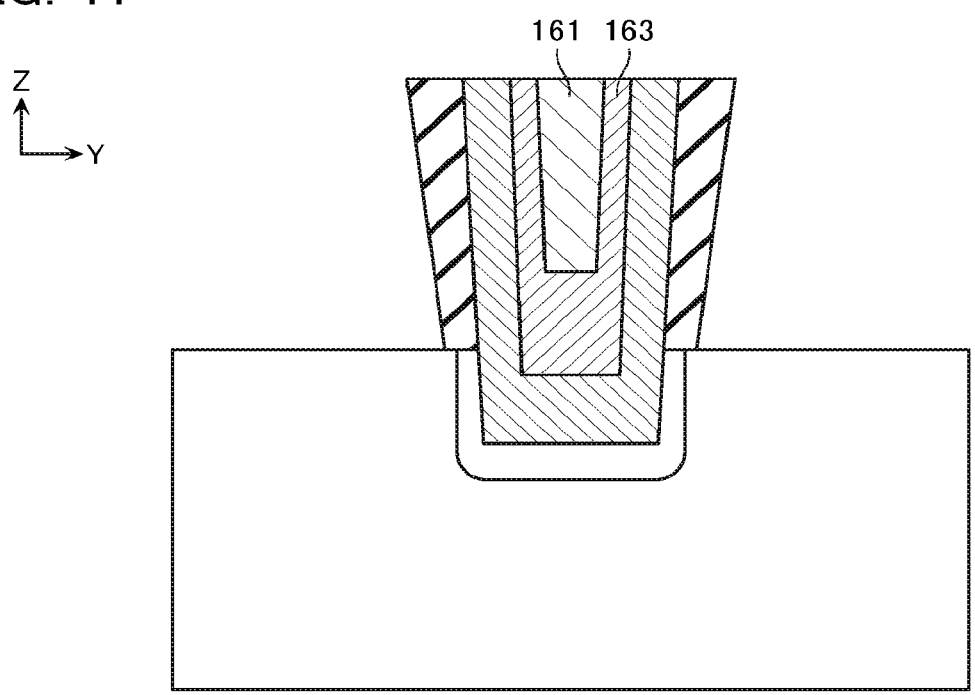

In FIG. 11, the conductive film 161 is embedded in the barrier film 163. The conductive film 161 is made of, for example, polysilicon (Poly-Si) into which an impurity is introduced.

Thereafter, although not shown, the barrier film 164 is deposited, and the conductive film 162 is embedded in the barrier film 164. The barrier film 164 is made of, for example, titanium (Ti), titanium nitride (TiN), or tantalum (Ta). The conductive film 162 is made of, for example, tungsten (W).

The conductive layer 108 illustrated in FIG. 5 is formed through the production processes described above.

In the embodiment, the metal diffusion prevention layer 165, of which the material is polysilicon (Poly-Si), is deposited prior to the deposition of the barrier film 163. In this case, the metal diffused from the barrier film 163 first reacts with polysilicon (Poly-Si) of the metal diffusion prevention layer 165. As a result, the diffusion of the metal to the semiconductor substrate 101 is suppressed, and thus, it is possible to reduce the silicide region to be formed in the semiconductor substrate 101 as compared to the comparative example. Thus, it is possible to thicken the film of the barrier film 163 without expanding the implanted region 101a (the white arrow a1 in FIG. 7), and accordingly, it is possible to realize the low resistance of the conductive layer 108 by the amount of the thickened film in the embodiment.

In other words, according to the embodiment, it is possible to provide the semiconductor memory device in which the low resistance of the source contact is realized without damaging the cut-off characteristic of the source-side select transistor even in a case in which the source contact having the hybrid structure that reduces the warpage of the wafer.

Incidentally, it is desirable to form the metal diffusion prevention layer 165 to be thick when considering the effect of preventing the diffusion of metal with respect to the semiconductor substrate 101. On the other hand, it is desirable to form a part thereof to be silicided as much as possible when considering the resistance of the metal diffusion prevention layer 165. When comparatively considering such points, it is desirable to form at least a contact part between the semiconductor substrate 101 and the conductive layer 108, which forms a path of the cell current, that is, a part of the metal diffusion prevention layer 165 equal to or lower than the upper surface of the semiconductor substrate 101, to have a film thickness of a degree at which the entire part is silicided and no metal is diffused to the semiconductor substrate 101.

Based on the above description, there is no need to cause the metal diffusion prevention layer 165 to be silicided, and the following structure, for example, may be provided.

Figure 12:
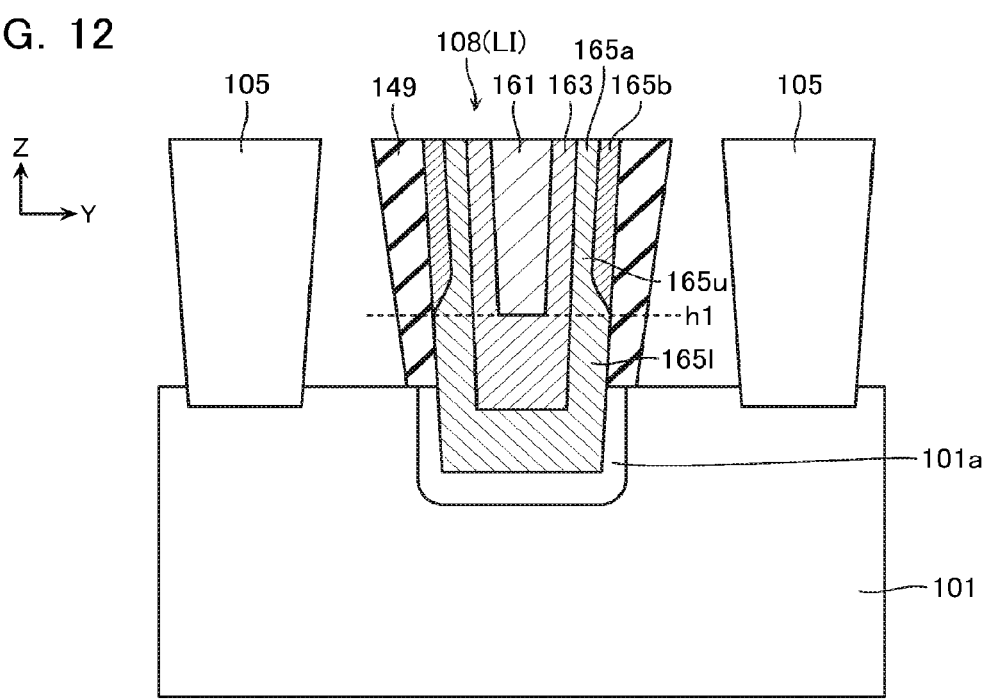
FIG. 12 is another cross-sectional view of the periphery of the bottom portion of the source contact of the semiconductor memory device according to the embodiment.

FIG. 12 is another cross-sectional view of the periphery of the bottom portion of the source contact of the semiconductor memory device according to the embodiment.

The metal diffusion prevention layer 165 includes both the silicide part 165a to be made of titanium (Ti), which is the metal of the barrier film 163, and the polysilicon portion 165b which is not silicided. This is because the film thickness of the barrier film 163 changes in the Z direction with a height h1, as a reference, which is a height of the bottom surface of the conductive film 161 and higher than the upper surface of the semiconductor substrate 101. In other words, a lower part 1651 of the metal diffusion prevention layer 165 equal to or lower than the height h1, in which the film thickness of the barrier film 163 is thick, is configured entirely only of the silicide part 165a while an upper part 165u upper than the height h1, in which the film thickness of the barrier film 163 is thin, is configured of the silicide part 165a and the polysilicon portion 165b. Further, the silicide part 165a of the upper part 165u is formed at the barrier film 163 side in the upper part 165u at which the metal of the barrier film 163 is easily diffused, and the polysilicon portion 165b is formed at the insulating layer 149 side at which the metal of the barrier film 163 is hardly diffused.

Even in a case in which the metal diffusion prevention layer 165 is not silicided as in FIG. 12, it is possible to obtain the same effect as the conductive layer 108 of FIG. 7 without damaging the conductivity of the conductive layer 108 as long as the part equal to or lower than the upper surface of the semiconductor substrate 101, which forms the path of the cell current, is silicided as described above. From such a point, it is desirable to arrange the metal diffusion prevention layer 165 to have a film thickness based on the amount of metal to be diffused from the bottom portion of the barrier film 163 upon the bottom surface of the conductive film 161, which is a changing point of the film thickness of the barrier film 163, is provided to be higher than the upper surface of the semiconductor substrate 101.

As above, certain embodiments of the present invention have been described, but these embodiments have been presented by way of example only, and are not intended to limit the scope of the inventions. Indeed, the novel embodiments described herein may be embodied in a variety of other forms, and further, various omissions, substitutions, and changes in the form of the embodiments described herein may be made without departing from the spirit of the inventions. The accompanying claims and their equivalents are intended to cover such forms or modifications as would fall within the scope and spirit of the inventions.

For example, the memory cell array 1 may have the following structure, for example, other than the structure illustrated in FIG. 3.

Figure 13:
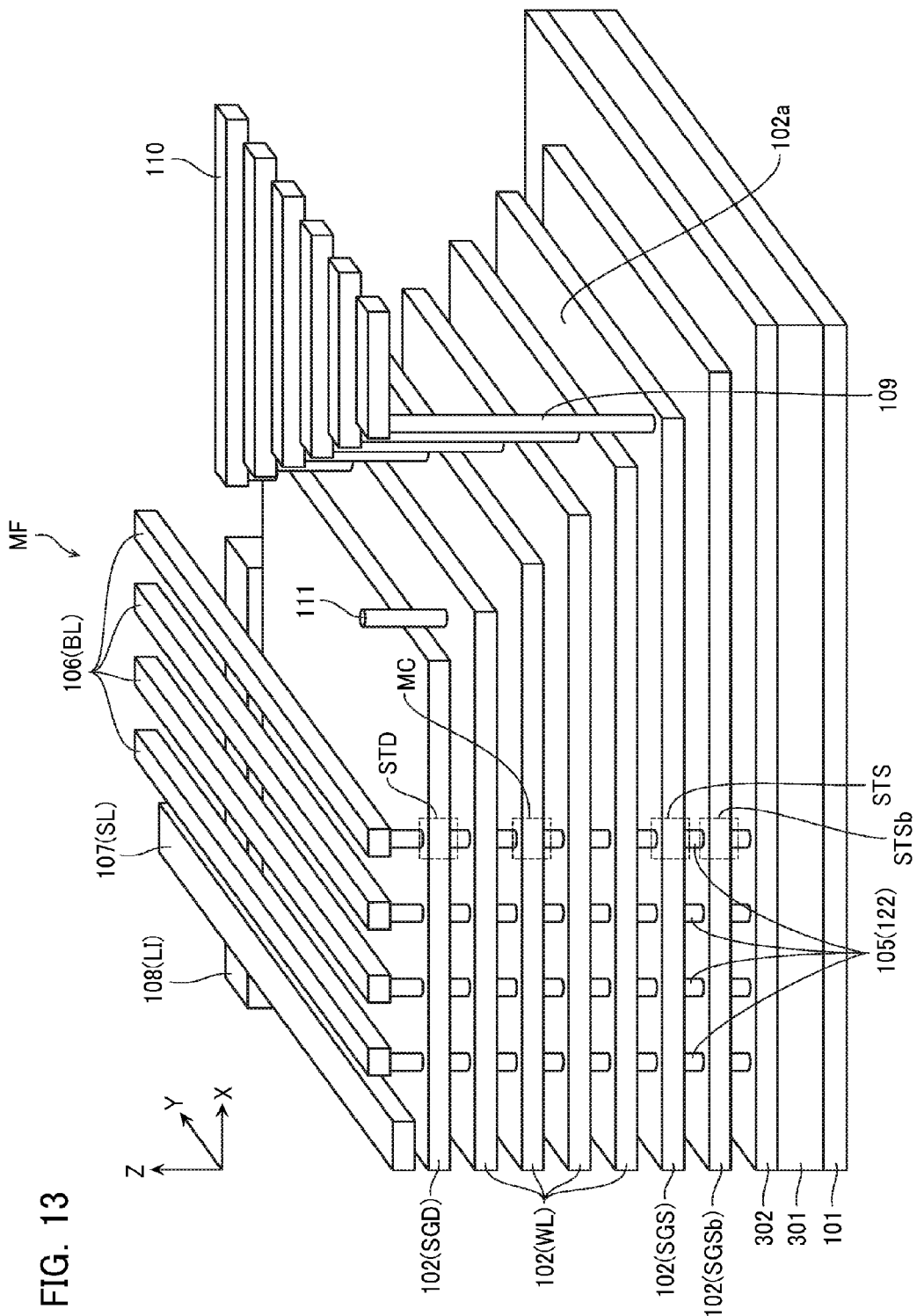
FIG. 13 is a perspective view illustrating another schematic structure of the memory cell array of the semiconductor memory device according to the embodiment.

FIG. 13 is a perspective view illustrating another schematic structure of the memory cell array of the semiconductor memory device according to the embodiment.

As illustrated in FIG. 13, a circuit layer 301 and a conductive layer 302 may be arranged between the semiconductor substrate 101 and the conductive layer 102 at the lowermost layer in the memory cell array 1. The circuit layer 301 includes, for example, a field-effect transistor (FET), a wiring, and the like. The conductive layer 302 is made of, for example, polysilicon (Poly-Si), tungsten (W), or the like. In addition, the conductive layer 302 may be connected to a lower end of the memory pillar 105 and the conductive layer 108 which functions as the source contact LI. In addition, a semiconductor layer made of silicon (Si) or the like, or an interlayer insulating layer made of silicon oxide ($SiO_2$) or the like may be arranged, instead of the semiconductor substrate 101, in the memory cell array 1 other than the structure illustrated in FIG. 18.

What is claimed is:

1. A semiconductor memory device comprising:
    a memory cell array, the memory cell array including:
        a first conductive layer which is arranged in a first direction above a first semiconductor layer;
        a second conductive layer which is arranged in the first direction above the first conductive layer;
        a columnar second semiconductor layer which extends in the first direction; and
        a contact unit which electrically connects the first semiconductor layer and the second conductive layer,
    the contact unit including:
        a first film which contains silicide as a first metal, and is in contact with the first semiconductor layer;
        a second film which contains the first metal, is in contact with the first film, and is in contact with the first semiconductor layer with the first film interposed therebetween:
        a third film; and
        a fourth film which is arranged in the first direction side by side with the third film, and extends in the first direction, and
    the second film being in contact with an upper surface, a bottom surface, and a side surface of the third film.

2. The semiconductor memory device according to claim 1, wherein
    the first film is arranged from a bottom surface of the contact unit to be equal to or upper than an upper surface of the first semiconductor layer in the first direction, and contains the silicide as the first metal across an entire surface from a bottom surface to an upper surface of the first film.

3. The semiconductor memory device according to claim 1, wherein the first metal is titanium (Ti).

4. The semiconductor memory device according to claim 1, wherein the second film contains the first metal which is nitrided.

5. The semiconductor memory device according to claim 1, wherein
    the third film contains polysilicon (Poly-Si), and
    the fourth film contains tungsten (W).

* * * * *